United States Patent [19]

Baba et al.

[11] Patent Number: 4,968,932
[45] Date of Patent: Nov. 6, 1990

[54] EVALUATION METHOD FOR SEMICONDUCTOR DEVICE

[75] Inventors: Yoshiro Baba; Yutaka Koshino; Seiji Yasuda, all of Yokohama, Japan

[73] Assignee: Kabushiki Kaisha Toshiba, Kawasaki, Japan

[21] Appl. No.: 251,601

[22] Filed: Sep. 30, 1988

[30] Foreign Application Priority Data

Sep. 30, 1987 [JP] Japan .................................. 62-244312

[51] Int. Cl.$^5$ ............................................ G01R 31/26
[52] U.S. Cl. ............................. 324/158 D; 324/158 T
[58] Field of Search ........... 324/158 D, 158 T, 158 R; 437/8

[56] References Cited

U.S. PATENT DOCUMENTS

| 4,296,372 | 10/1989 | Feuerbaum | 324/158 D |
| 4,609,867 | 9/1986 | Schink | 324/158 D |
| 4,675,601 | 6/1987 | Zoutendyk et al. | |

FOREIGN PATENT DOCUMENTS 83-02512  7/1983  PCT Int'l Appl. .

OTHER PUBLICATIONS

European Search Report, EP 8811 6112.
Japanese Journal of Applied Physics, "Novel Method for Measuring Intensity Distribution of Focused Ion Beams", vol. 22, No. 12, pp. 780–782.
N.T.I.S. Technical Notes, "Electron Beam Could Probe Recombination Centers", No. 8, Aug., 1984, Part B, p. 570.
The Society of Photo-Optical Instrumentation Engineers, "Applications of a Two-Wavelength Laser Scanner . . . ", vol. 276, pp. 61–69, Apr., 1981.
Solid State Electronics, "Scanning Electron Microscope Measurements on Short Channel MOS Transistors", vol. 23, No. 4, pp. 345–356, Apr., 1980.
Stengl, R., "High-Voltage Planar Junctions Investigated by the OBIC Method", IEEE Transactions on Electron Devices, vol. ED-34, No. 4, pp. 911–919.

Primary Examiner—Reinhard J. Eisenzopf
Assistant Examiner—Edward Urban
Attorney, Agent, or Firm—Finnegan, Henderson, Farabow, Garrett and Dunner

[57] ABSTRACT

An evaluation method for a semiconductor device includes the steps of applying a reverse bias voltage between an N-type substrate formed in a surface of the semiconductor device and a P-type region formed in a surface of the N-type substrate to form a depletion layer along the junction therebetween, scanning the surface of the semiconductor device is one direction with a light beam to cause an optical beam induced current to be flow across the junction, and measuring the OBIC intensity profile on a scanning line extending across the depletion layer in the surfaces of the N-type substrate and P-type region. In the method, the light beam has a wavelength whose penetration length is smaller than the depth or thickness of the P-type region, the OBIC intensity profile is integrated over a range corresponding to the depletion layer, and the integrated value is normalized by the reverse bias voltage to determine the surface potential distribution of the semiconductor device.

4 Claims, 7 Drawing Sheets

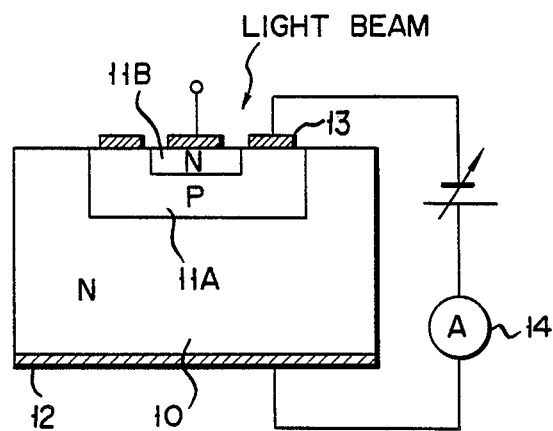
F I G. 1
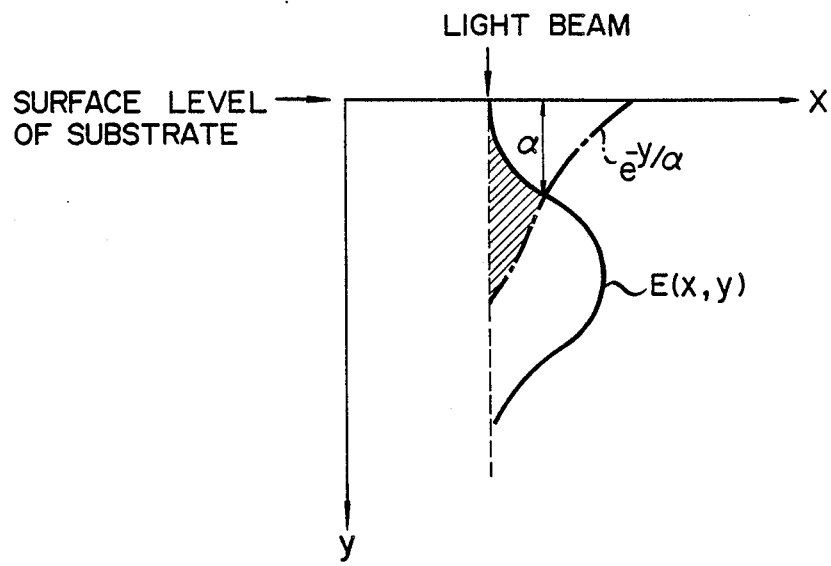
F I G. 2

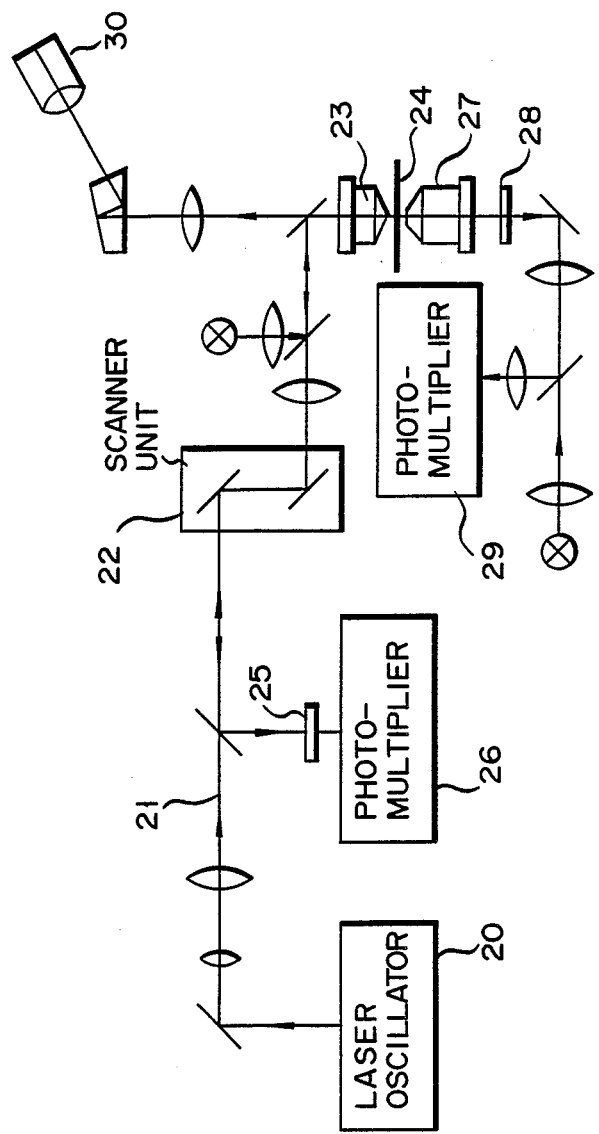
F I G. 3

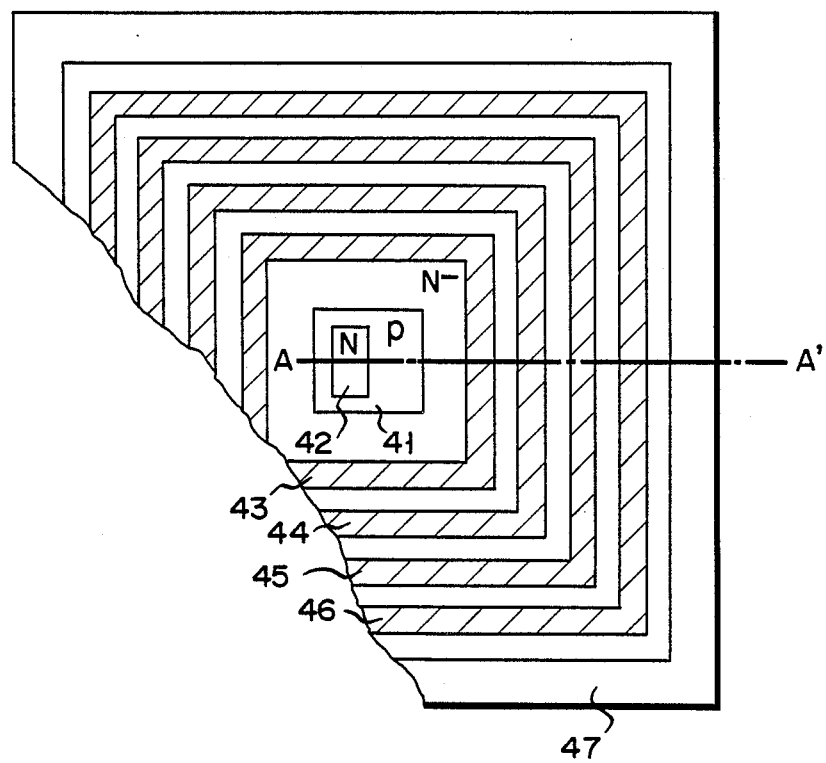
F I G. 4A
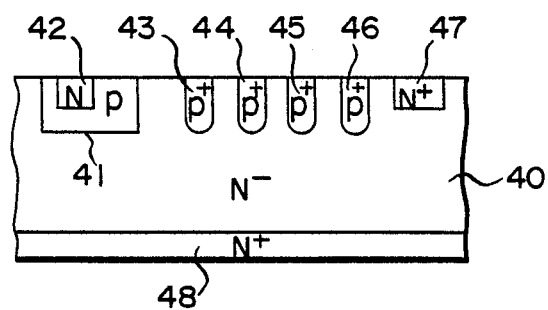
F I G. 4B

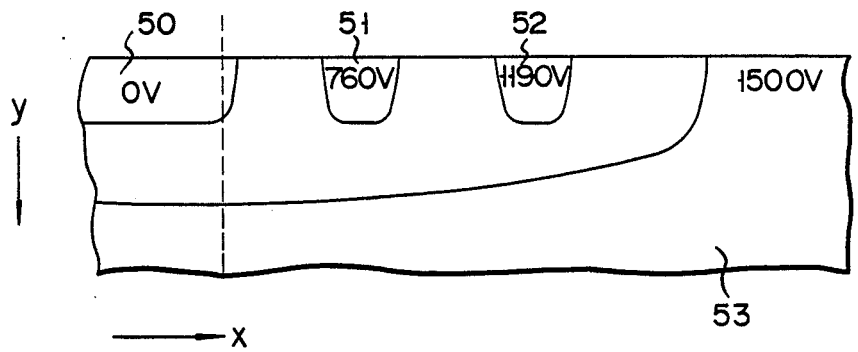
F I G. 7
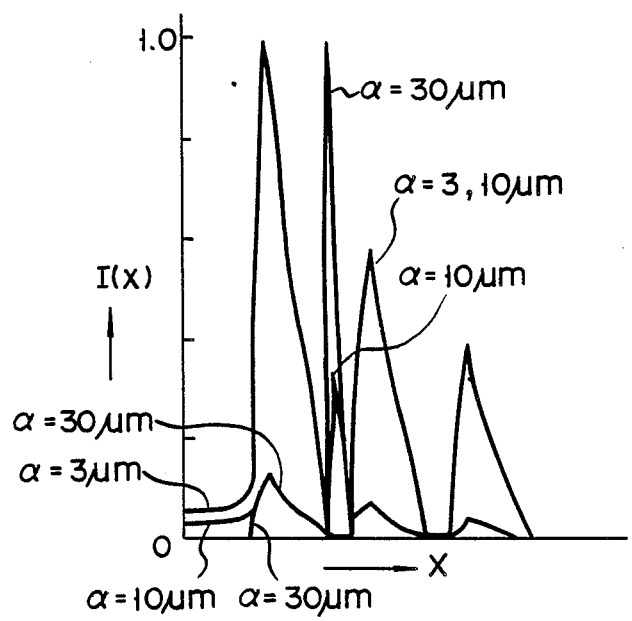
F I G. 8

F I G. 9
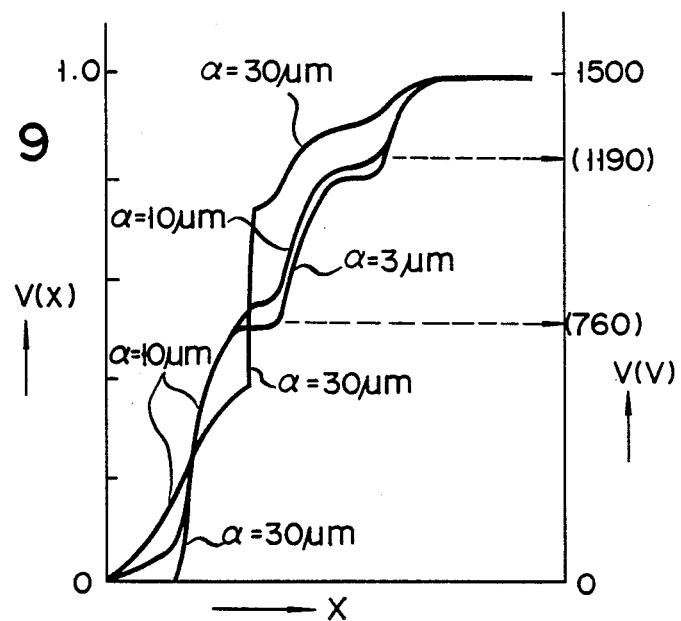
F I G. 10
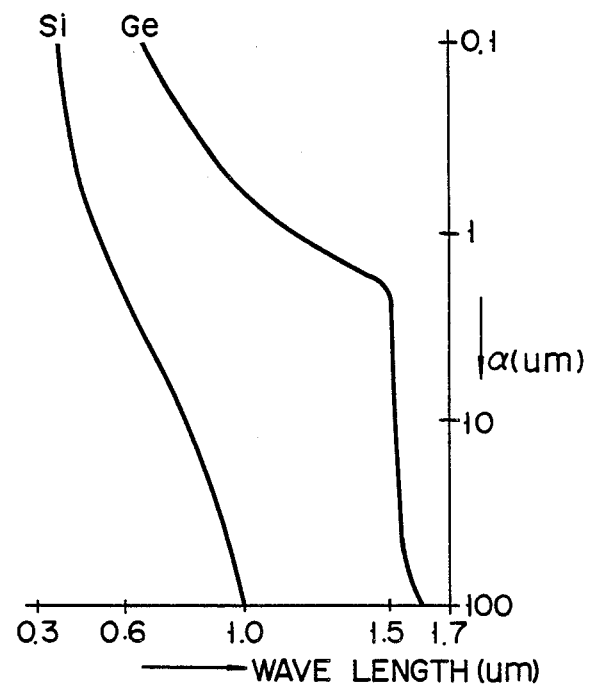

EVALUATION METHOD FOR SEMICONDUCTOR DEVICE

BACKGROUND OF THE INVENTION

1. Field of the Invention

This invention relates to an evaluation method for semiconductor devices, and more particularly to an evaluation method for semiconductor devices for measuring the distribution of potential o the surface and in the internal portion of the semiconductor device.

2. Description of the Related Art

Conventionally, a method is developed to analyze the abnormality in two-dimensional diffusion of depletion layer and crystal defect in a semiconductor device. In this method, the PN junction of the semiconductor device is reversely biased, and a light beam focused by a lens or the like is scanned on the surface of the semiconductor device. At this time, photo-induced current flows across the PN junction of the semiconductor device. The current is detected in position corresponding to the scanning position, and an image is displayed with brightness corresponding to the detected current value on a monitoring screen. The image is known as an optical beam induced current (OBIC) image, and the two-dimensional diffusion of depletion layer and crystal defect in the semiconductor device can be analyzed based on variation in brightness in the OBIC image.

Thus, the evaluation of the semiconductor device is conventionally effected based on the qualitative analysis.

For example, potential inside the semiconductor device can be attained by causing the CAD system to effect simulation in the designing stage of the semiconductor device. However, in the prior art, the potential is not actually measured.

SUMMARY OF THE INVENTION

An object of this invention is to provide an evaluation method for semiconductor devices capable of measuring the potential distribution inside the semi conductor device.

The above object is attained by an evaluation method for a semiconductor device comprising the steps of applying a reverse bias voltage between a first semiconductor region of a first conductivity type formed in a surface of the first semiconductor device and a second semiconductor region of a second conductivity type formed in a surface of the first semiconductor region to form a depletion layer along the junction therebetween; scanning the surface of the semiconductor device in one direction with a light beam having a wavelength whose penetration length is smaller than the depth or thickness of the second semiconductor region to cause an optical beam induced current to be flow across the junction; measuring the OBIC intensity profile on a scanning line extending across the depletion layer in the surfaces of the first and second semiconductor regions; integrating the OBIC intensity profile over a range corresponding to the depletion layer; and normalizing the integrated value by the reverse bias voltage to determine the surface potential distribution of the semiconductor device.

With this evaluation method, the actual potential distribution can be measured based on the OBIC intensity profile obtained by applying light beam to the surface of the semiconductor device.

BRIEF DESCRIPTION OF THE DRAWINGS

FIG. 1 is a circuit diagram for measuring optical beam induced current flowing across a PN junction of a semiconductor device in a step of a method according to this invention;

FIG. 2 is a characteristic diagram showing the relation between the intensity of light incident to the semiconductor device and electric field in the semiconductor device;

FIG. 3 is a diagram showing the construction of a laser scanning microscope used to effect the method of this invention;

FIG. 4A is a diagram showing a plan view of a patterned transistor;

FIG. 4B is a cross sectional view taken along line A—A' of FIG. 4A;

FIG. 7 is a diagram showing the surface potential distribution of a bipolar transistor derived out by simulation using two-dimensional Poisson equation;

FIG. 8 is a characteristic diagram showing an OBIC intensity profile on the semiconductor device with such as construction as shown in FIG. 7;

FIG. 9 is a characteristic diagram showing the surface potential distribution of the semiconductor device with such a construction as shown in FIG. 7;

FIG. 10 is a characteristic diagram showing the relation between the wave length and penetration length of illuminated light.

DETAILED DESCRIPTION OF THE PREFERRED EMBODIMENTS

Figure 5:
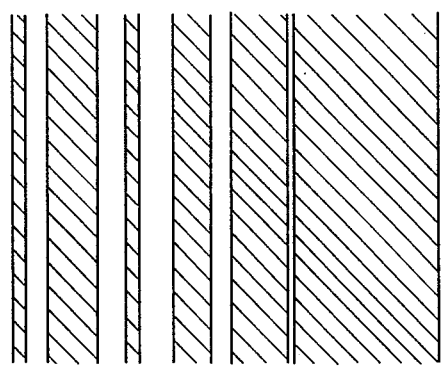
FIG. 5 is a diagram showing an OBIC image on the surface of the transistor of FIGS. 4A and 4B.

There will now be described an evaluation method for semiconductor devices according to an embodiment of this invention with reference to FIGS. 1 to 13.

FIG. 1 shows a circuit for measuring optical beam induced current (OBIC) flowing across the PN junction of a semiconductor device, for example, bipolar transistor. The semiconductor device is formed of N-type semiconductor substrate 10, P-type diffusion region 11A formed in substrate 10 and N-type diffusion region 11B formed in region 11A. In a case where the potential distribution in the surface of the semiconductor device is measured, a reverse bias voltage is applied to the PN junction between substrate 10 and region 11A. That is, collector electrode 12 formed on N-type semiconductor substrate 10 and base electrode 13 formed on P-type diffusion region 11A are respectively set at negative and positive potentials. Under this condition, a light beam with a predetermined wavelength is applied to the surface of the semiconductor device and scanned in a preset direction. In the scanning operation, OBIC flowing across the PN junction is detected by ammeter 14, and the OBIC intensity profile in the scanned area can be obtained based on variation in the detected current. The value of OBIC is determined by the intensity of incident light and electric field in position of the semiconductor device to which the light beam is applied.

In a case where a constant intensity of the light beam is applied to the surface of the semiconductor device, it is possible to consider that the OBIC intensity profile expresses the distribution of electric field in the scanned area. Assume now that the intensity of electric field in the internal portion of the semiconductor device is E(x,y) (x indicates a position in the surface of the semiconductor device and y indicates a position in a depth direction of the semiconductor device). When a light beam with penetration length α is applied to an penetrates into the semiconductor device as shown in FIG. 2, the light beam is attenuated in a depth direction at a rate expressed by function of $e^{-y/\alpha}$.

If the distribution of electric field at light incident position x in a depth direction is expressed by E(x,y), OBIC intensity profile I(x) can be expressed by the following equation:

$$I(x) = \int_0^\infty e^{-y/\alpha} \cdot E(x,y) dy \quad (1)$$

Relative potential V(x) in each position along the x axis on the surface of the semiconductor device can be derived based on OBIC intensity profile I(x) by the following equation:

$$V(x) = \left\{ \int_0^x I(x)dx \right\} / \left\{ \int_0^\infty I(x)dx \right\} \quad (2)$$

Further, relative potential V(x) is normalized by using a bias voltage applied between electrodes 12 and 13 so as to determine the actual potential distribution.

The above-described OBIC intensity profile and OBIC image can be obtained by an OBIC device having a laser scanning microscope.

FIG. 3 is a diagram schematically showing the construction of the laser scanning microscope. A light beam emitted from laser oscillator 20 is directed to X-Y scanner unit 22 via optical path diffuser 21, and then illuminated on test piece 24 via objective lens 23. Light reflected from test piece 24 is transmitted in the above-described optical path in an opposite direction and directed to reflected light detection photomultiplier 26 via filter 25, and then the intensity of the reflected light is detected. In contrast, light transmitted through test piece 24 is directed to transmission light detection photomultiplier 29 via condenser lens 27 and filter 28, and then the intensity of the transmission light is detected. Eyepiece 30 for visual observation is disposed above objective lens 23. With this construction, focused light is applied to and scanned on a semiconductor device or test piece 24.

Next, a method of measuring the potential distribution of a bipolar transistor used as a test piece and having a guard ring structure which permits the depletion layer to spread in a lateral direction is explained.

Figure 6:
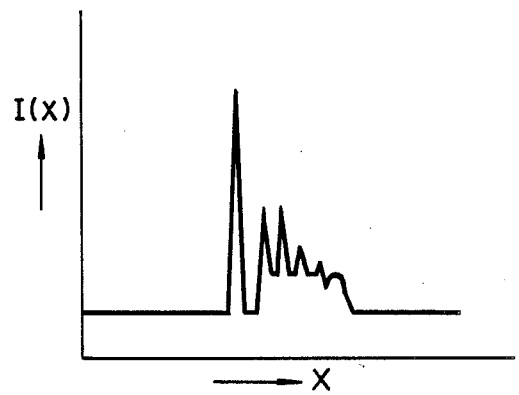
FIG. 6 is a diagram showing an OBIC intensity profile on the surface of the transistor of FIGS. 4A and 4B.

FIG. 4A is a plan view of a patterned NPN transistor having four guard rings, and FIG. 4B is a cross sectional view taken along lines A—A' of FIG. 4A. The transistor includes N-type substrate 40, P-type base region 41, N-type emitter region 42, first to fourth P-type guard ring regions 43 to 46, N-type equipotential ring region 47, and N-type collector contact region 48 formed on the rear surface thereof. With the transistor of this construction, voltages of 0 V and +1400 V are respectively applied to base region 41 and collector contact region 48 so as to apply reverse-bias voltage of 1400 V between the base and collector regions of the transistor. Further, a light beam is applied to the transistor by using the device shown in FIG. 3 to detect an OBIC image and OBIC intensity profile. FIGS. 5 and 6 respectively show the OBIC image and OBIC intensity profile. As is clearly seen from FIG. 6, the OBIC intensity is high in the vicinity of the base end portion and four guard rings.

The surface potential distribution of the transistor shown in FIGS. 4A and 4B can be determined by carrying out the calculation of equation (2) based on the thus obtained OBIC intensity profile.

In the prior art, it is impossible to actually measure the electric field and potential inside the semiconductor device. For this reason, the potential distribution is derived out by simulation using the following two-dimensional Poisson equation.

$$\frac{\partial^2 V(x,y)}{\partial x^2} + \frac{\partial^2 V(x,y)}{\partial y^2} = -\frac{q}{\epsilon} \{\Gamma(x,y) + P(x,y) - n(x,y)\} \quad (3)$$

where V(x,y), is potential, Γ(x,y) is an impurity concentration profile, P(x,y) is a hole concentration, n(x,y) is an electron concentration, ε is a dielectric factor, and q is electron charge.

For simplifying the explanation, a bipolar transistor having two guard rings is used to obtain the potential distribution by simulation, and the potential distribution thus obtained is shown in FIG. 7. The semiconductor device shown in FIG. 7 includes base region 50, first guard ring region 51, second guard ring region 52, and collector region or substrate 53. That is, in the semiconductor device, base region 50 and two guard rings 51 and 52 are formed in the form of a diode structure. In this case, depth xj of base region 50 is set to 20 μm, impurity concentration Nsub of substrate 53 is set to $8 \times 10^{13}/cm^3$, a reverse bias voltage between base region 50 and collector region 53 is set to 1500 V. Under this condition, the surface potential of the semiconductor device was simulated by using the two-dimensional Poisson equation. As shown in FIG. 7, the result was that the potential of base region 50 is 0 V, the potential of first guard ring region 51 is 760 V, the potential of second guard ring region 52 is 1190 V, and the potential of collector region 53 is 1500 V.

FIG. 8 shows characteristic diagrams of OBIC intensity profile I(x) obtained when light beams having penetration lengths α of 3 μm, 10 μm and 30 μm, are applied to the semiconductor device with such a construction as shown in FIG. 7. When the light beams with the penetration lengths of 3 μm and 10 μm are applied to the semiconductor device, substantially the same OBIC intensity profile can be obtained. When the light beam with the penetration length of 30 μm is applied to the semiconductor device, the OBIC intensity becomes high at the end portion of first guard ring region 51 which lies on the side of base region 50. FIG. 9 is a characteristic diagram showing actual potential obtained by normalizing potential V(x) which is derived out from the OBIC intensity profiles by application voltage of 1500 V. The profiles of V(x) obtained when penetration length α is set at 3 μm and 10 μm are approximately equal to each other. The potentials of first and second guard ring regions 51 and 52 can be determined to be 760 V and 1190 V by reading potential levels at the flat portions in the V(x) profile. The potential levels are substantially the same as those obtained by simulation using the two-dimensional Poisson equation.

However, when penetration length α is set at 30 μm, information relating to the layer lying under base region 50 will be mixed into the profile of potential V(x). Therefore, in order to correctly determine the potentials of first and second guard rings 51 and 52, it is not desirable to use a light beam with penetration length α larger than the depth of the diffusion region. It was experimentally proved that the best result can be attained when penetration length α is set smaller than half the depth of the diffusion region.

FIG. 10 is a characteristic diagram showing the relation between the wave length (μm) of an illumination light beam and penetration length α (μm) for Si or Ge. As shown in FIG. 7, for example, in a case where base region 50 is formed with a depth of 20 μm in a Si semiconductor device, it is preferable to set penetration length α to 10 μm which is half the depth of base region 50. It is understood from FIG. 10 that a light beam with a wave length of 0.8 μm is applied to the semiconductor device in order to attain penetration length α of 10 μm. The light beam with such wave length can be generated from a compound optical semiconductor laser oscillator of Ga, As and P, for example.

In the above embodiment, the potential distribution on the surface of the semiconductor device can be determined by using the OBIC intensity profile. Therefore, when the semiconductor device is designed by CAD, it is possible to make full use of the CAD by performing the integrating operation in the CAD.

There will now be described another embodiment of this invention. In the above embodiment, the potential distribution on the surface of the semiconductor device is determined by applying a light beam of a preset wave length. However, it is possible to determine the intensity of electric field in the internal portion of the semiconductor device based on OBIC intensity profiles obtained by applying light beams of different penetration lengths. The intensity determination method is explained below.

OBIC intensity profile I(α) obtained when a light beam with penetration length α is illuminated to a position lying in an X-axis direction on the surface of the semiconductor device shown in FIG. 7 can be determined as follows:

$$I(\alpha) = \int_0^\infty e^{-y/\alpha} \cdot E(y) dy \quad (4)$$

The integral equation can be numerically solved as follows.

$$Ij = \sum_i eji \cdot Ei \quad (5)$$

wherein i is a numerical value indicating the position in the depth direction of the semiconductor device ($1 \leq i \leq n$), j is a numerical value indicating the wave length of a light beam to be illuminated ($1 \leq j \leq m$), $Ei = E(yi)$, and $eji = \exp(-yj/\alpha i)$.

In a case where the intensity of electric field E(y) in a depth direction is derived as a solution of simultaneous linear equations, n=m is the required condition. That is, it is necessary to set the value of {Ei} equal to that of {Ij}.

Figure 13:
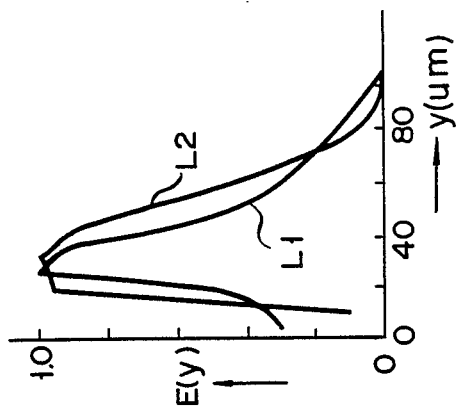
FIGS. 11 to 13 are diagrams showing the distribution of electric field intensity in methods of different embodiments according to this invention.
Figure 12:
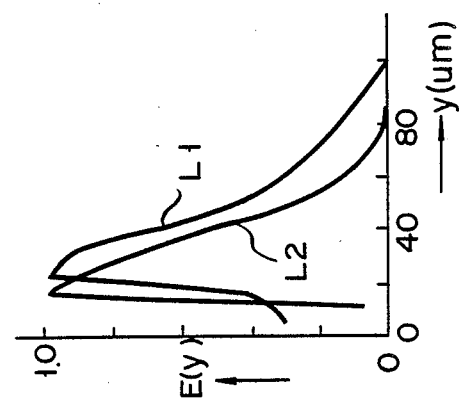
Figure 11:
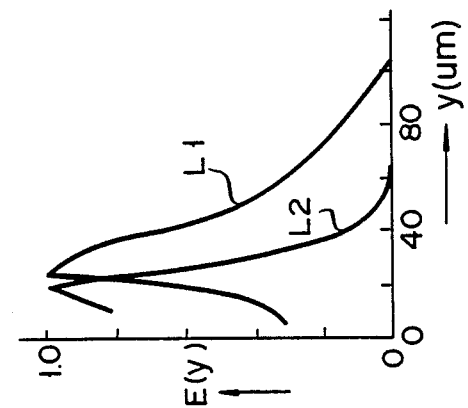

FIGS. 11 to 13 are characteristic diagrams showing the intensity of electric field in the depth direction (y direction) in a position near base region 50 indicated by broken lines in the semiconductor device of FIG. 7. In each of FIGS. 11 to 13, characteristic curve L1 indicates the intensity of electric field obtained by simulation using the two-dimensional Poisson equation, and characteristic curve L2 indicates the intensity of electric field obtained from the OBIC intensity profile. In this case penetration length α is set in the range of 0 μm to 200 μm.

Characteristic curves in FIGS. 11 to 13 are derived out by measuring the intensities of electric field at 10 points. For example, in FIG. 11, penetration length a is set to 20 μm, 40 μm, 60 μm, 80 μm, 100 μm, 120 μm, 140 μm, 160 μm, 180 μm and 200 μm, in FIG. 12, penetration length a is set to 4 μm, 6 μm, 8 μm, 12 μm, 14 μm, 16 μm, 18 μm, 20 μm, 22 μm, and 24 μm, and in FIG. 13 penetration length a is set to 4 μm, 5 μm, 6 μm, 7 μm, 8 μm, 10 μm, 11 μm, 12 μm, 13 μm, and 14 μm, In FIG. 11, characteristic curves L1 and L2 are not similar to each other, but in FIGS. 12 and 13, characteristic curves L1 and L2 are much similar to each other. Judging from the result, it is not desirable to use a light beam with a large penetration length α. Further, in a case where the distribution of electric field in the semiconductor device is determined, it is preferable to set the penetration length of the light beam smaller than the depth of the diffusion region.

As described above, according to this invention, it is possible to determine the distribution of the surface potential or internal electric field of the semiconductor device based on the OBIC intensity profile.

What is claimed is:

1. An evaluation method for determining a surface potential distribution of a semiconductor device having a first semiconductor region of a first conductivity type and a second semiconductor region of a second conductivity type, the first semiconductor region formed at a surface of the semiconductor device and the second semiconductor region formed at a surface of the first semiconductor region contiguous said surface of the semiconductor device and surrounded by the first semiconductor region, the first and second semiconductor regions forming a junction, comprising the steps of:

applying a reverse bias voltage between the first and second semiconductor regions to form a depletion layer in the first semiconductor region along the junction;

scanning said surface of the semiconductor device in a lateral direction along said surface with a light beam forming a scanning line, said light beam having a wavelength with a penetration length less than a depth dimension of the second semiconductor region substantially perpendicular to said lateral scanning direction to cause an optical beam induced current to flow across said junction;

measuring an optical beam induced current intensity profile on the scanning line extending throughout the lateral extent thereof corresponding to the depletion layer;

integrating the optical beam induced current intensity profile over said lateral extent corresponding to the depletion layer; and normalizing the integrated optical beam induced current intensity profile in reference to the reverse bias voltage to determine the surface potential distribution of the semiconductor device.

2. An evaluation method according to claim 1, wherein said penetration length of the wavelength of the light beam is less than one half the depth dimension of said second semiconductor region.

3. An evaluation method according to claim 1, wherein said scanning step includes the substep of scanning the surface of the semiconductor device in a lateral direction along said surface with at least two light beams each having a different wavelength and the penetration length of each wavelength being less than the depth dimension of said second semiconductor region to provide a plurality of corresponding optical beam induced current intensity profiles on the scanning line.

4. An evaluation method according to claim 3, wherein a distribution of electric field E(x,y) at a coordinate (x,y), x being a point in said scanning line and y being a point in the depth dimension of said semiconductor device, is related to said plurality of optical beam induced current intensity profiles as the following integral equation:

$$I(x,\alpha) = \int_0^\infty e^{-y/\alpha} \cdot E(x,y) dy$$

wherein $I(x,\alpha)$ is an optical beam induced current intensity profile obtained for a penetration length $\alpha$ of the light beam.

* * * * *

UNITED STATES PATENT AND TRADEMARK OFFICE
CERTIFICATE OF CORRECTION

PATENT NO. : 4,968,932

DATED : November 6, 1990

INVENTOR(S) : Yoshiro BABA et al.

It is certified that error appears in the above-identified patent and that said Letters Patent is hereby corrected as shown below:

Abstract, line 7, change "is" to --in--; and

Abstract, line 9, delete "be".

Column 1, line 11, change "o" to --on--;

Column 1, line 43, change "semi conductor" to --semiconductor--; and

Column 1, line 57, delete "be".

Signed and Sealed this

Eighteenth Day of August, 1992

*Attest:*

DOUGLAS B. COMER

*Attesting Officer*     Acting Commissioner of Patents and Trademarks